United States Patent
Schlenter

(10) Patent No.: US 8,646,387 B2
(45) Date of Patent: Feb. 11, 2014

(54) DETONATOR CONNECTOR AND DETONATOR SYSTEM

(75) Inventor: Craig Charles Schlenter, Sandton (ZA)

(73) Assignee: Detnet South Africa (Pty) Ltd, Sandton (ZA)

( * ) Notice: Subject to any disclaimer, the term of this patent is extended or adjusted under 35 U.S.C. 154(b) by 0 days.

(21) Appl. No.: 13/395,375

(22) PCT Filed: Sep. 9, 2009

(86) PCT No.: PCT/ZA2009/000082
§ 371 (c)(1),
(2), (4) Date: Mar. 9, 2012

(87) PCT Pub. No.: WO2011/032189
PCT Pub. Date: Mar. 17, 2011

(65) Prior Publication Data
US 2012/0167792 A1   Jul. 5, 2012

(51) Int. Cl.
*F42D 1/055* (2006.01)
*H03K 17/284* (2006.01)

(52) U.S. Cl.
USPC ........... 102/217; 102/311; 102/200; 102/264; 361/249

(58) Field of Classification Search
USPC ......... 102/200, 206, 215, 217, 218, 262, 264, 102/301, 311, 312, 322; 361/249
See application file for complete search history.

(56) References Cited

U.S. PATENT DOCUMENTS

| | | | |
|---|---|---|---|
| 4,846,066 A | 7/1989 | Beattie et al. | |
| 5,571,985 A * | 11/1996 | Ritter et al. | 102/217 |
| 6,608,445 B2 * | 8/2003 | Melvin et al. | 315/82 |
| 7,337,723 B2 * | 3/2008 | Koekemoer et al. | 102/264 |
| 7,530,311 B2 * | 5/2009 | Koekemoer et al. | 102/215 |
| 7,694,627 B2 | 4/2010 | Koekemoer et al. | |
| 7,911,760 B2 | 3/2011 | Lownds | |
| 7,946,227 B2 | 5/2011 | Koekemoer et al. | |
| 2003/0107322 A1 | 6/2003 | Melvin et al. | |
| 2013/0036931 A1 * | 2/2013 | Schlenter | 102/206 |

FOREIGN PATENT DOCUMENTS

WO   WO 2007124517 A2 * 11/2007

OTHER PUBLICATIONS

PCT/ZA2009/000082 International Search Report and Written Opinion dated May 31, 2010 (8 pages).
PCT/ZA2009/000082 International Preliminary Report on Patentability dated Dec. 23, 2011 (16 pages).

* cited by examiner

*Primary Examiner* — James Bergin
(74) *Attorney, Agent, or Firm* — Michael Best & Friedrich LLP

(57) ABSTRACT

A connector (30) which connects a detonator to a two-wire harness (14) from a control unit (12) and which includes a timer which, after a timing interval, enables the connection of a following detonator in a sequence to the harness (12).

7 Claims, 3 Drawing Sheets

DETONATOR CONNECTOR AND DETONATOR SYSTEM

CROSS-REFERENCE TO RELATED APPLICATION

This patent application is a national stage filing under 35 U.S.C. 371 of International Application No. PCT/ZA2009/000082, filed 9 Sep. 2009, the disclosure of which are incorporated by reference herein in its entirety. Priority to this application is hereby claimed.

BACKGROUND OF THE INVENTION

This invention relates generally to a detonator system and particularly is concerned with a two-wire system which can be operated in a daisy chain fashion.

The cost of electrical conductors constitutes a significant component in the overall cost of a detonating system. It should be borne in mind that the prospect of recovering a conductor from a blast site is, at best, remote. It is therefore desirable to be able to reduce the quantity of electrical conductors used in a blasting system.

A plurality of detonators can be interconnected to one another in a so-called daisy chain configuration. In this arrangement detonators are addressed sequentially and communication with a first detonator is then followed by communication with a second, succeeding detonator, and so on. Typically a daisy chain configuration requires a four-wire detonator harness and the individual detonators are successively connected to a three-or-four-wire surface harness to make up a desired blast configuration.

The specification of PCT/AU2006/000315 describes an electronic blasting system in which detonators are connected to a surface harness by two-wire leads and wherein an actuator is positioned between adjacent detonators. In its simplest form the actuator is a switch and is operable in response to an appropriate command signal. This means that the actuator must possess the capability to identify, and then respond to, the command signal which may be one of a plurality of possible signals.

A similar approach is disclosed in the specification of U.S. Pat. No. 4,846,066. This document discloses detonators which are connected in such a way that programming signals will only be received by a given detonator when an adjacent detonator, nearer to a signal output, has been programmed. This is achieved by making use of a connector which is associated with each detonator. The connector includes a switching device which is operated by a logic element. Signals can only pass beyond a connector when a detonator associated with the connector has been programmed.

The present invention aims to provide a detonator system in which the need for a logic element in the connector is eliminated.

SUMMARY OF THE INVENTION

The invention provides a connector for making a connection in a blasting system which includes a control unit, a harness which extends from the control unit and which has first and second electrical conductors, and a plurality of detonators, the connector including a timer, powered from the first and second conductors, to initiate a timing interval, and a switch, responsive to an end of the timing interval, to effect an electrical connection via the first conductor between the control unit and a third conductor which is connected to a detonator.

A fourth conductor may be connected to the detonator. The fourth conductor may be connected to the second conductor by the connector.

The timer may include a resistor/capacitor timer.

The switch may be responsive to a voltage across the capacitor. The switch may be a semiconductor device and may close when the voltage across the capacitor reaches a predetermined value.

The timer may be responsive to a voltage on the first and second conductors.

The switch may include first and second field effect transistors, a junction to which the source of the first transistor and the source of the second transistor are connected, a first diode connected to the source and drain of the first transistor which conducts from the source to the drain of the first transistor, a second diode connected to the source and drain of the second transistor which conducts from the source to the drain of the second transistor, and a resistor/capacitor timer connected to the junction.

The semiconductor device switch referred to may thus be constituted by the first and second field effect transistors which are connected in series and which are switched to a conductive state in unison.

Signals for communicating with the detonator may be impressed on the first and second conductors. A signalling technique may be adopted which makes use of polarity reversal for communicating with each detonator. Each detonator may reply to a signal source by modulating current in the first and second conductors.

The invention also extends to a detonator system which includes:

a control unit, first and second conductors which extend from the control unit, at least first and second connectors, each connector being of the aforementioned kind, connected to the first and second conductors at respective spaced locations, and at least first and second detonators, wherein the first detonator is connected to the first connector, the second detonator is connected to the second connector, and the switch of the first connector effects an electrical connection via the first conductor between the control unit and the second detonator.

In a different form of the invention the switch of the first connector effects an electrical connection via the first conductor between the control unit and the first detonator.

The invention also provides a method of establishing a detonator system which includes the steps of:

a) connecting two conductors to a control unit,
b) in response to a voltage or signal, from the control unit on the conductors, initiating a timing interval,
c) at the end of the timing interval connecting a detonator to the control unit via the conductors, and
d) repeating steps (b) and (c) for another detonator.

The method may include the step, prior to the end of the timing interval, of using the control unit to assign an identity number to, or to read an identity number from, a detonator previously connected to the control unit via the conductors.

The timing interval is preferably established by a circuit in a connector which is used to connect a detonator to the conductors.

BRIEF DESCRIPTION OF THE DRAWINGS

The invention is further described by way of examples with reference to the accompanying drawings in which.

DESCRIPTION OF PREFERRED EMBODIMENTS

Figure 1:
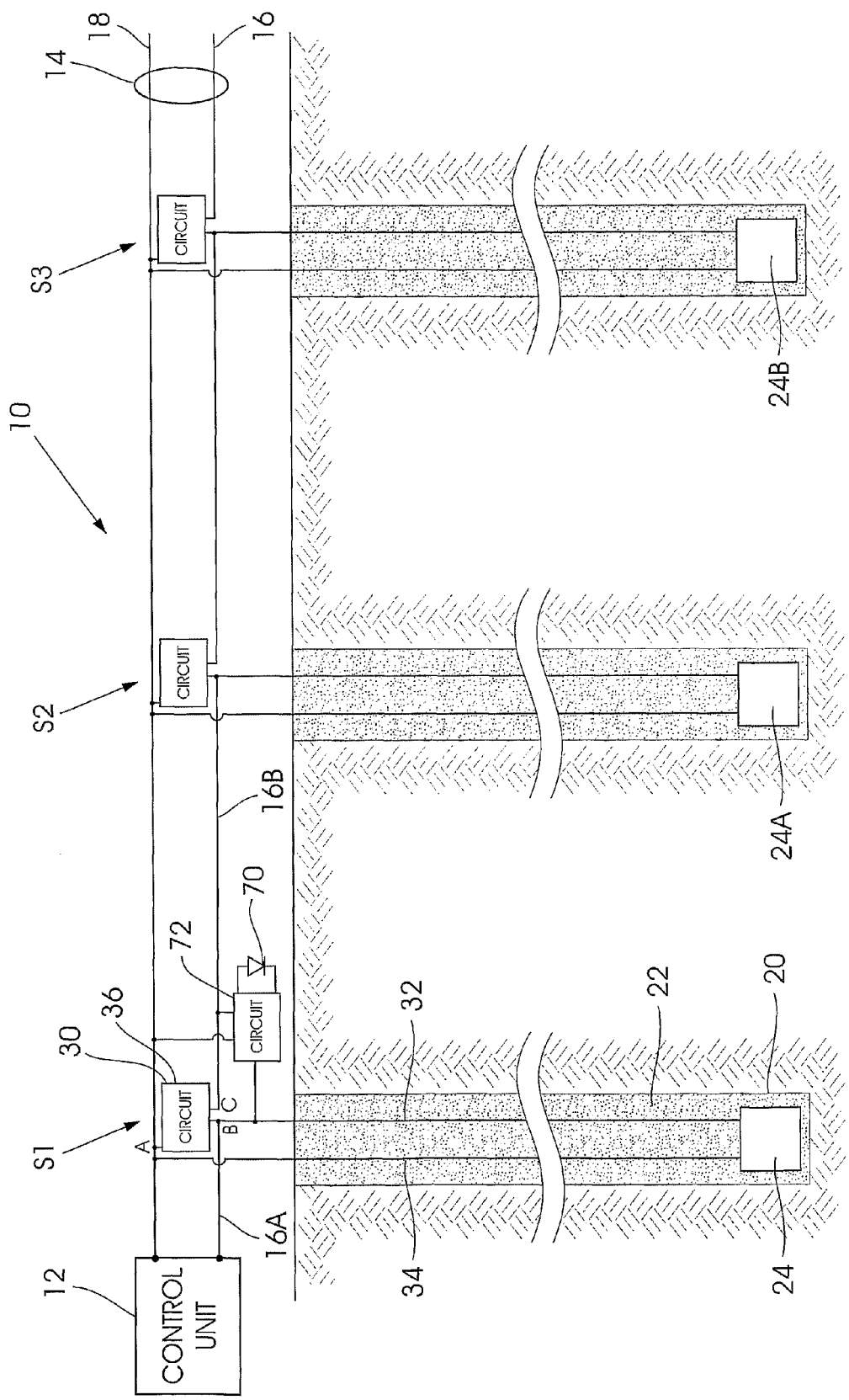
FIG. 1 illustrates part of a detonator system established in accordance with one form of the invention.

FIG. 1 of the accompanying drawings illustrates a detonator system 10 according to the invention which includes a control unit 12 which is connected to a harness 14 which includes elongate first and second electrical conductors 16 and 18 which extend, along a desired path, to a plurality of boreholes 20.

Each borehole includes an explosive composition 22 and an electrically programmable detonator 24. The interconnected detonators make up an elongate string of detonators, of indeterminate number. For ease of explanation hereinafter the detonator in the second borehole is designated 24A, in the third borehole 24B, and so on. The detonators may be identical to one another and are labelled in this way merely for purposes of identification.

In respect of each detonator, a respective connector 30 is used to connect the first and second conductors 16 and 18 to third and fourth conductors 32 and 34 respectively which extend to the detonator.

Figure 2:
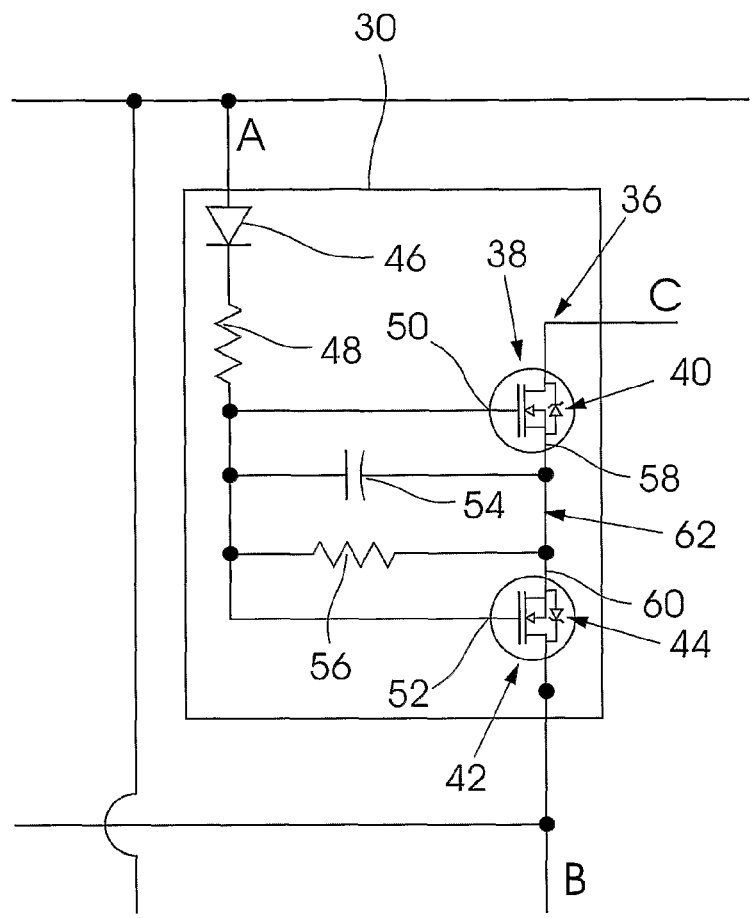
FIG. 2 illustrates a circuit in a connector of the detonator system of FIG. 1.

A housing of the connector carries a circuit 36 which is shown in detail in FIG. 2. The circuit has terminals A, B and C and includes a switch made up of a first field effect transistor 38 which is bridged by a diode 40, and a second field effect transistor 42 which is bridged by a diode 44. Typically the diodes are provided in an integral package with the respective transistors but, if this is not the case, the diodes are added to the circuit as discrete components.

A diode 46 and a resistor 48, are connected in series to the gate 50 of the transistor 38, and to the gate 52 of the transistor 42. A parallel arrangement of a capacitor 54 and a resistor 56 is connected across the gate 50 and the source 58 of the transistor 38 and, similarly, across the gate 52 and the source 60 of the transistor 42. The source 58 is directly connected to the source 60 at a junction 62. As is explained hereinafter the circuit has a time constant, determined by the resistor 48 and the capacitor 54, which are connected in series to the junction 62.

The connector preferably includes circuit modules (not shown) which are designed to give static and voltage protection and which enable the circuit 36 to function in a polarity-insensitive manner. These aspects are not expanded upon herein for they play no part in an understanding of the principles of the present invention.

The circuit 36 functions as follows. If the voltage at the terminal A is higher than the voltage at the terminal B, the capacitor 54 charges via the diode 44. When the gate-to-source voltage is sufficiently high, each transistor turns on. The terminal C is thereby connected to the terminal B. A similar sequence takes place if the voltage at the terminal A is higher than the voltage at the terminal C. The circuit thus functions as a switch S, the operation of which is voltage-dependent and, hence, in the context, time-dependent. For the sake of convenience the switching action of the transistors 38 and 42 in the connector associated with the first detonator is equated to the operation of a switch S1, in the second connector to the operation of a switch S2, and so on.

Referring again to FIG. 1 the terminal A is connected to the second conductor 18. The terminal B is connected to an upstream section 16A of the conductor 16 and the terminal C is connected to a downstream section 16B of the conductor 16. The conductor 16 is broken between the terminals B and C. This description pertains to the first connector in the sequence i.e. for the detonator 24. Clearly in respect of the second detonator 24A the downstream section 16B is, in fact, an upstream section and, similarly, down the string of detonators.

The housing of the connector is preferably in two or more parts which are opened to facilitate engaging the conductors with the connector and which are locked to one another to make the required electrical connections and to ensure that the conductors remain in the desired configuration. Preferably the first conductor 16 is automatically broken (severed) between the terminals B and C as the connector parts are locked to one another. This facilitates the described connection process.

Figure 4:
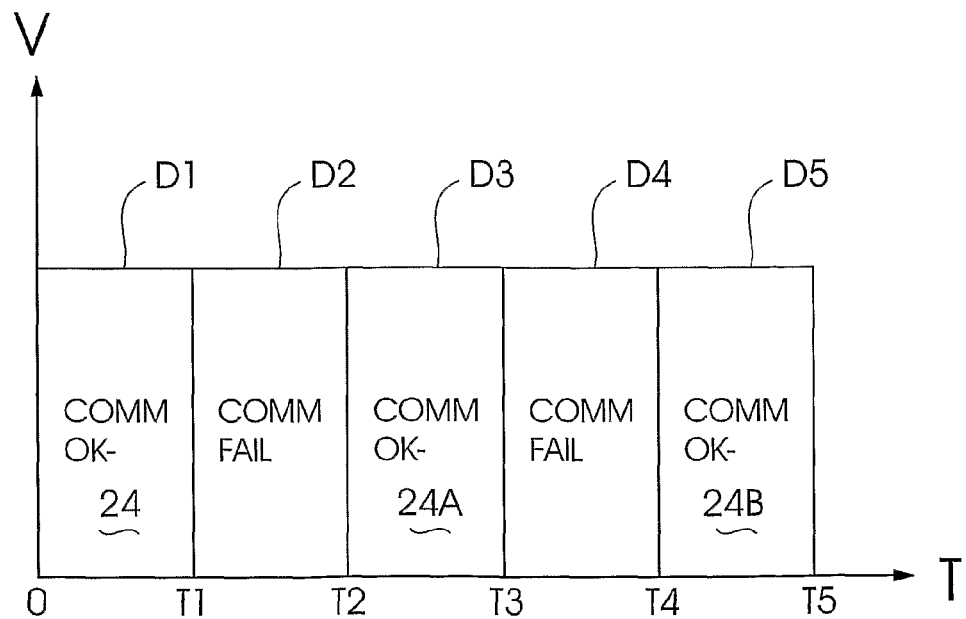
FIG. 4 is a timing diagram of communication sequences on a harness in the detonator system.

FIG. 4 shows time slots D1 to D5 etc. for communication signals which are impressed on the first and second conductors 16 and 18 by the control unit 12. The slots extend for time intervals 0 to $T_1$; $T_1$ to $T_2$; $T_2$ to $T_3$; $T_3$ to $T_4$; $T_4$ to $T_5$; and so on.

Initially the switches S1, S2 . . . in the various connectors are open and only the detonator 24 is connected directly to the control unit via the upstream conductor section 16A and the conductor 18. Assume that the control unit now generates a signal commencing at time t=0 in order to communicate with the detonator 24.

An objective of this communication is to allow the control unit to configure the detonator 24 appropriately. An identity number can be assigned to the detonator 24 or, if the detonator has previously been loaded with an identity number, the control unit can read the identity number from the detonator.

During the time slots D1 and D2 no communication is possible with any detonator which is downstream of the first detonator 24. This is because the switch S1 is open. The switch S1 closes at time t=$T_2$. The time interval 0 to $T_2$, which ideally equals the time constant associated with the switch S1, is longer than the period required for communication for identification purposes of the detonator 24 which, typically, is accomplished during the first time slot D1.

At the beginning of the third time slot D3 communication can be established between the control unit and the detonator 24A. Communication downstream of the detonator 24A, between the control unit and the detonator 24B, or any following detonator, is not possible as the switch S2 is open. Communication with the detonator 24A, in order to identify the detonator, is typically accomplished by the end of the third time slot D3. At the end of the fourth time slot D4 the switch S2 closes and communication between the control unit and the third detonator 24B is then possible. The process continues in this way.

The time constant associated with each switch is not precisely predictable because of the effects of tolerances in the components of the relevant circuit 36. Thus communication with a particular detonator should be attempted as soon as communication with a preceding detonator in the sequence has been completed. An alternative, less preferred, option would be for the control unit only to attempt communicating with a detonator shortly after the switch associated with the preceding detonator is calculated to have closed. A disadvantage of this approach is that errors in the timing circuits can accumulate and, if the accumulated error exceeds the design time constant of a particular circuit 36, it is possible for the control unit to be connected simultaneously to two detonators. At that stage it would not be possible for the control unit to distinguish the detonators.

The signal which is directed from the control unit to each connector may be in the form of a polarity-reversing signal and may vary according to requirement and operational factors. The signal may for example constitute a command to a detonator to respond if the detonator has not previously been addressed or if the detonator is in a newly powered state or if it has a factory assigned identifier. The detonator may respond by modulating the current in the upstream conductor section 16A and in the conductor 18.

The signal may include a unique identifier which is transferred to, and stored in, a memory in the detonator. Identifiers can be assigned sequentially or by using any other suitable technique. If a unique identifier has been assigned to the detonator, then the control unit can read the identifier from the detonator. Additionally or alternatively the control unit can read the detonator status or perform such other communication as may be necessary or desirable.

System parameters such as current consumption and current leakage may also be monitored by the control unit. This may aid with fault finding.

When the switch S1 closes charging commences of the capacitor in following circuit 36. If the signal has a 50% duty cycle and losses are ignored, the time constant will be given by 2*R*C where R is the resistive value of the resistor 48 and C is the capacitive value of the capacitor 54. The diode 46 ensures that signals of an incorrect polarity do not have an effect on the circuit. Also, charging of the capacitor is only effected during transitions with the correct polarity.

As noted, signals to a detonator may include identifier assignment, identifier reading and any other communication as may be necessary or desirable. The impedance presented by the harness to the control unit may change abruptly when a switch closes and this can be used to change the behaviour of the control unit, if desired.

When communication with a detonator starts the detonator should be put in a state in which it is possible to communicate with the detonator, in future, by using an appropriate identifier. Furthermore, the detonator should not respond to commands that may be issued during attempts to communicate with subsequent, newly connected, detonators on the harness.

The process continues in the aforesaid manner in that, for each detonator, a respective switch is closed at the end of a timing interval. As the detonators are sequentially connected to the control unit it is possible to assign a unique identifier to, or to read a unique identifier from, each detonator so that the detonators can be distinguished from each other in a way which enables the geographical position of each detonator to be ascertained—this latter aspect follows from the fact that the detonators are sequentially connected to the harness.

After an identifier is assigned to, or established for, a detonator the system functions to connect a succeeding detonator to the control unit. The preceding detonators are, in fact, connected in parallel to the control unit. The preceding detonators however have unique identifiers assigned to them and consequently are readily distinguishable from the last detonator in the train which, initially, either has no identifier, or has a factory-assigned identifier, or is in a state in which will respond to a specific signal, from the control unit, intended to detect newly connected detonators.

An optional feature which could be beneficial under certain conditions is the inclusion of a respective light-emitting diode in each connector (shown for the first connector only, in FIG. 1). The functioning of the diode is controlled by a suitable circuit 72, the operation of which lies within the scope of one skilled in the art, which is connected to the terminals A, B and C, as appropriate. If the detonator is successfully connected to the control unit the circuit pulses the diode 70 once or a number of times. This feature could be useful to a person who is establishing a blasting system, for example in poorly lit underground conditions, for it provides a visual indication that the detonator in question has been successfully connected to the harness.

Once all the detonators in the system have been sequentially connected to the control unit, via the harness by means of the switches, each detonator can be addressed directly by relying on the identifier which is associated with the detonator. Timing delay and other information, if necessary, can be transferred to each detonator as required. During this process all of the switches in the various connectors are kept closed. Timing delays may be assigned based on user input, the position of a target detonator in the string, from a preloaded list or by using any other suitable technique.

The invention thus makes it possible to establish what is known as a daisy chain system wherein a main harness which has only two wires is connected to an elongate string of detonators which can be uniquely addressed. Two wires leading to each respective detonator are coupled to the harness using a respective connector, for each detonator, without requiring complex electronics in the connector and without a requirement for the electronics to have a logical capability to respond to commands from the control unit. The electronic circuits which form part of the detonator system operate independently from power-up to enable successive detonators to be connected in sequence. Once all detonators are powered and identities have been assigned to, or established for, each detonator, the signals destined for a particular detonator are determined only by the identifier associated with the detonator. This type of daisy chain system can be used highly effectively in conjunction with the teachings in PCT/ZA2004/000079, the content of which specification is hereby incorporated. The international specification discloses the use of markers which enable a detonator in an elongate string of detonators to be distinguished from an adjacent detonator. This type of marker, which can be uniquely addressed, can be connected to the harness 14 using an appropriate connector 30 in a manner similar to what has been described hereinbefore.

As the detonators are connected in sequence to the control unit, if a connection fault should occur it is possible to pinpoint the fault and then take remedial action. A surface harness break or an end of a detonator string results in no reply to a signal request from the control unit beyond the break or the end point. Current leakage due to downhole wire damage, for example, is only measurable once the problem detonator has been connected. The location of the fault is readily determined, for a transition from a low leakage state to a high leakage state takes place when the problem detonator is connected.

A failure to break the conductor 16 upon connection of a connector 30 results in the simultaneous connection of two detonators to the control unit. This event may manifest itself as a communication problem with the detonators at that point as the two detonators will potentially reply simultaneously to a request, resulting either in a corrupt reply or in a reply of increased current amplitude. A downhole wire break results in no reply during one of the testing periods. By using appropriate algorithms these fault conditions can be identified and displayed at the control unit.

It is important that the current consumption of the connector electronics is minimized from a scalability perspective, i.e. determining the number of detonators that can be connected, and so that the current consumption for a timer circuit does not interfere with communications with the detonators. The time constant chosen for a timer circuit should provide sufficient time to establish communication between a detonator and the control unit, and for transmission of a full sequence of signals required to identify a detonator uniquely (for subsequent communications) and to place the detonator in a state in which it does not interfere with the identification of, and other activities associated with, detonators subsequently connected to the harness.

The circuit 36 includes the resistor 56 which acts to discharge the voltage across the capacitor 50 over an extended period provided no voltages are impressed on the conductors 16 and 18. As the voltage across the capacitor 54 is decreased a stage is reached at which one or both transistors open and the respective detonator is disconnected from the control unit. All the detonators can again be connected to the control unit simply by maintaining an adequate charging voltage on the conductors 16 and 18 for an extended period which is in excess of the sum of the timing intervals for the individual connectors.

Figure 3:
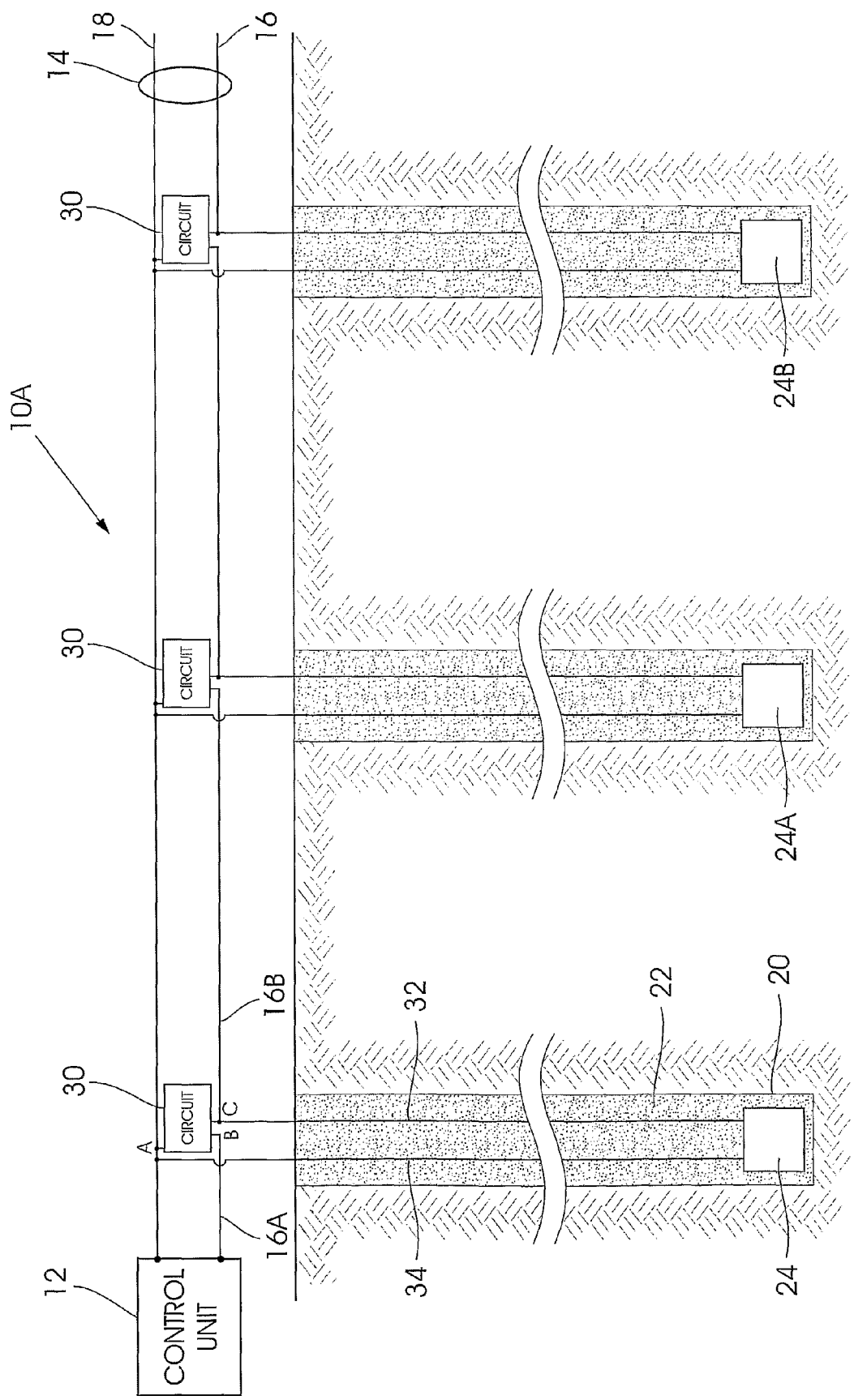
FIG. 3 is similar to FIG. 1 and shows a detonator system according to a different form of the invention.

The invention has been described thus far with reference to FIG. 1. In an alternative arrangement 10A of the detonator system, shown in FIG. 3, the third conductor 32, extending to each detonator, is connected to the terminal C and not to the terminal B. In broad terms the operation of the arrangement shown in FIG. 3 is the same as what is shown in FIG. 1, but the circuit 36 associated with a detonator controls the connection of that detonator to the control unit whereas in the FIG. 1 arrangement the circuit 36 associated with one detonator controls the connection of a following detonator to the control unit.

The invention claimed is:

1. A detonator system which includes a control unit, first and second conductors which extend from the control unit, at least first and second connectors connected to the first and second conductors at respective spaced locations, and at least first and second detonators, wherein each connector includes a timer, powered from the first and second conductors, to initiate a timing interval, and a switch, which is responsive to an end of the timing interval, to effect an electrical connection via the first conductor between the control unit and a third conductor which is connected to a detonator and which includes first and second field effect transistors, a junction to which the source of the first transistor and the source of the second transistor are connected, a first diode connected to the source and drain of the first transistor which conducts from the source to the drain of the first transistor, a second diode connected to the source and drain of the second transistor which conducts from the source to the drain of the second transistor and wherein the timer, which is a resistor/capacitor timer, is connected to the junction and wherein the first detonator is connected to the first connector, the second detonator is connected to the second connector, and the switch of the first connector effects an electrical connection via the first conductor between the control unit and either the first detonator or the second detonator.

2. A detonator system according to claim 1, wherein a fourth conductor, connected to each detonator, is connected to the second conductor.

3. A detonator system according to claim 2 wherein the respective switch in each timer, is responsive to a voltage across the capacitor.

4. A detonator system according to claim 3 wherein each respective connector includes a light emitter which is actuated upon operation of the respective switch.

5. A detonator system according to claim 2 wherein each respective connector includes a light emitter which is actuated upon operation of the respective switch.

6. A detonator system according to claim 1 wherein each respective connector includes a light emitter which is actuated upon operation of the respective switch.

7. A detonator system according to claim 1 wherein the respective switch in each timer, is responsive to a voltage across the capacitor.

* * * * *